(12) United States Patent
Chiu

(10) Patent No.: US 11,776,934 B2
(45) Date of Patent: Oct. 3, 2023

(54) SEMICONDUCTOR APPARATUS AND FABRICATION METHOD THEREOF

(71) Applicant: INNOSCIENCE (ZHUHAI) TECHNOLOGY CO., LTD., Zhuhai (CN)

(72) Inventor: Han-Chin Chiu, Zhuhai (CN)

(73) Assignee: INNOSCIENCE (ZHUHAI) TECHNOLOGY CO., LTD., Zhuhai (CN)

(*) Notice: Subject to any disclaimer, the term of this patent is extended or adjusted under 35 U.S.C. 154(b) by 0 days.

(21) Appl. No.: 17/750,424

(22) Filed: May 23, 2022

(65) Prior Publication Data
US 2022/0285314 A1    Sep. 8, 2022

Related U.S. Application Data

(63) Continuation of application No. 16/921,963, filed on Jul. 7, 2020, now Pat. No. 11,367,706.

(30) Foreign Application Priority Data

Apr. 16, 2020 (CN) .......................... 202010301464.1

(51) Int. Cl.
*H01L 25/04* (2023.01)
*H01L 29/08* (2006.01)
*H01L 29/66* (2006.01)

(52) U.S. Cl.
CPC ........ *H01L 25/043* (2013.01); *H01L 29/0847* (2013.01); *H01L 29/66477* (2013.01)

(58) Field of Classification Search
CPC ............... H01L 25/043; H01L 29/0847; H01L 29/66477; H01L 29/7786; H01L 29/0657;
(Continued)

(56) References Cited

U.S. PATENT DOCUMENTS 8,686,473 B1 * 4/2014 Micovic ............ H01L 29/66916
257/194
9,276,077 B2 * 3/2016 Basu ................. H01L 21/28575
(Continued)

FOREIGN PATENT DOCUMENTS

CN    102318048 A    1/2012
CN    109888002 A    6/2019

OTHER PUBLICATIONS

State Intellectual Property Office of the People's Republic of China, Office Action and Search Report Issued in Application No. 202010301464.1, dated Mar. 25, 2023, 27 pages. (Submitted with Machine Translation).

*Primary Examiner* — Jonathan Han
(74) *Attorney, Agent, or Firm* — McCoy Russell LLP

(57) ABSTRACT

A semiconductor apparatus includes a channel layer, a barrier layer, a source contact and a drain contact, a first doped group III-V semiconductor, a group III-V semiconductor, and a second doped group III-V semiconductor. The barrier layer is disposed on the channel layer. The source contact and the drain contact are disposed on the channel layer. The first doped group III-V semiconductor is disposed on the barrier layer. The group III-V semiconductor is disposed on the first doped group III-V semiconductor and between the source contact and the drain contact. The second doped group III-V semiconductor is disposed on the group III-V semiconductor and between the source contact and the drain contact. The group III-V semiconductor has a central region covered by the second doped group III-V semiconductor and a peripheral region free from coverage by the second doped group III-V semiconductor.

20 Claims, 17 Drawing Sheets

(58) Field of Classification Search
CPC ........... H01L 29/66462; H01L 23/3171; H01L 29/1066; H01L 29/155; H01L 29/2003; H01L 29/41766; H01L 29/0638; H01L 29/1033; H01L 29/207; H01L 29/7783
See application file for complete search history.

(56) References Cited

U.S. PATENT DOCUMENTS

| | | | |
|---|---|---|---|
| 2001/0013604 A1* | 8/2001 | Hase | H01L 29/66462 |
| | | | 257/E29.05 |
| 2013/0082276 A1 | 4/2013 | Park et al. | |
| 2019/0221660 A1* | 7/2019 | Dasgupta | H01L 29/66462 |
| 2021/0167200 A1* | 6/2021 | Radosavljevic | H01L 29/66431 |

* cited by examiner

SEMICONDUCTOR APPARATUS AND FABRICATION METHOD THEREOF

CROSS REFERENCE TO RELATED APPLICATIONS

This application is a continuation application of U.S. application Ser. No. 16/921,963, filed on Jul. 7, 2020, which claims priority of CN Patent Application No. 202010301464.1 filed on Apr. 16, 2020, the disclosure of which is hereby incorporated by reference in its entirety.

BACKGROUND OF THE INVENTION

1. Field of the Invention

The present disclosure relates to a semiconductor apparatus and a fabrication method thereof, and in particular, to a semiconductor apparatus with a group III-V semiconductor, and a fabrication method thereof.

2. Description of the Related Art

A component that includes a direct bandgap semiconductor, for example, a semiconductor component that includes a category-III-V material or a category-III-V compound, can operate or work in various conditions or environments (for example, under different voltages or frequencies) due to their properties.

Such semiconductor components may include a heterojunction bipolar transistor (HBT), a heterojunction field effect transistor (HFET), a high-electron-mobility transistor (HEMT), or a modulation-doped field effect transistor (MODFET), and the like.

SUMMARY OF THE INVENTION

Some embodiments of the present disclosure disclose a semiconductor apparatus, including a channel layer, a barrier layer, a source contact and a drain contact, a first doped group III-V semiconductor, a group III-V semiconductor, and a second doped group III-V semiconductor. The barrier layer is disposed on the channel layer. The source contact and the drain contact are disposed on the channel layer. The first doped group III-V semiconductor is disposed on the barrier layer and between the source contact and the drain contact. The group III-V semiconductor is disposed on the first doped group III-V semiconductor and between the source contact and the drain contact. The second doped group III-V semiconductor is disposed on the group III-V semiconductor and between the source contact and the drain contact. The group III-V semiconductor has a central region covered by the second doped group III-V semiconductor and a peripheral region free from coverage by the second doped group III-V semiconductor.

Some embodiments of the present disclosure disclose a semiconductor apparatus, including a channel layer, a barrier layer, a source contact and a drain contact, a first doped group III-V semiconductor, a group III-V semiconductor, a second doped group III-V semiconductor, and a passivation layer. The barrier layer is disposed on the channel layer. The source contact and the drain contact are disposed on the channel layer. The first doped group III-V semiconductor is disposed on the barrier layer and between the source contact and the drain contact. The group III-V semiconductor is disposed on the first doped group III-V semiconductor and between the source contact and the drain contact. The second doped group III-V semiconductor is disposed on the group III-V semiconductor and between the source contact and the drain contact. The passivation layer is disposed over the barrier layer and covering the first doped group III-V semiconductor, the group III-V semiconductor, and the second doped group III-V semiconductor. The passivation layer continuously extends from a top surface to a side surface of the group III-V semiconductor.

BRIEF DESCRIPTION OF THE DRAWINGS

The aspects of the present disclosure will become more comprehensible from the following detailed description made with reference to the accompanying drawings. It should be noted that, various features may not be drawn to scale. In fact, the sizes of the various features may be increased or reduced arbitrarily for the purpose of clear description.

PREFERRED EMBODIMENT OF THE PRESENT INVENTION

Figure 1:
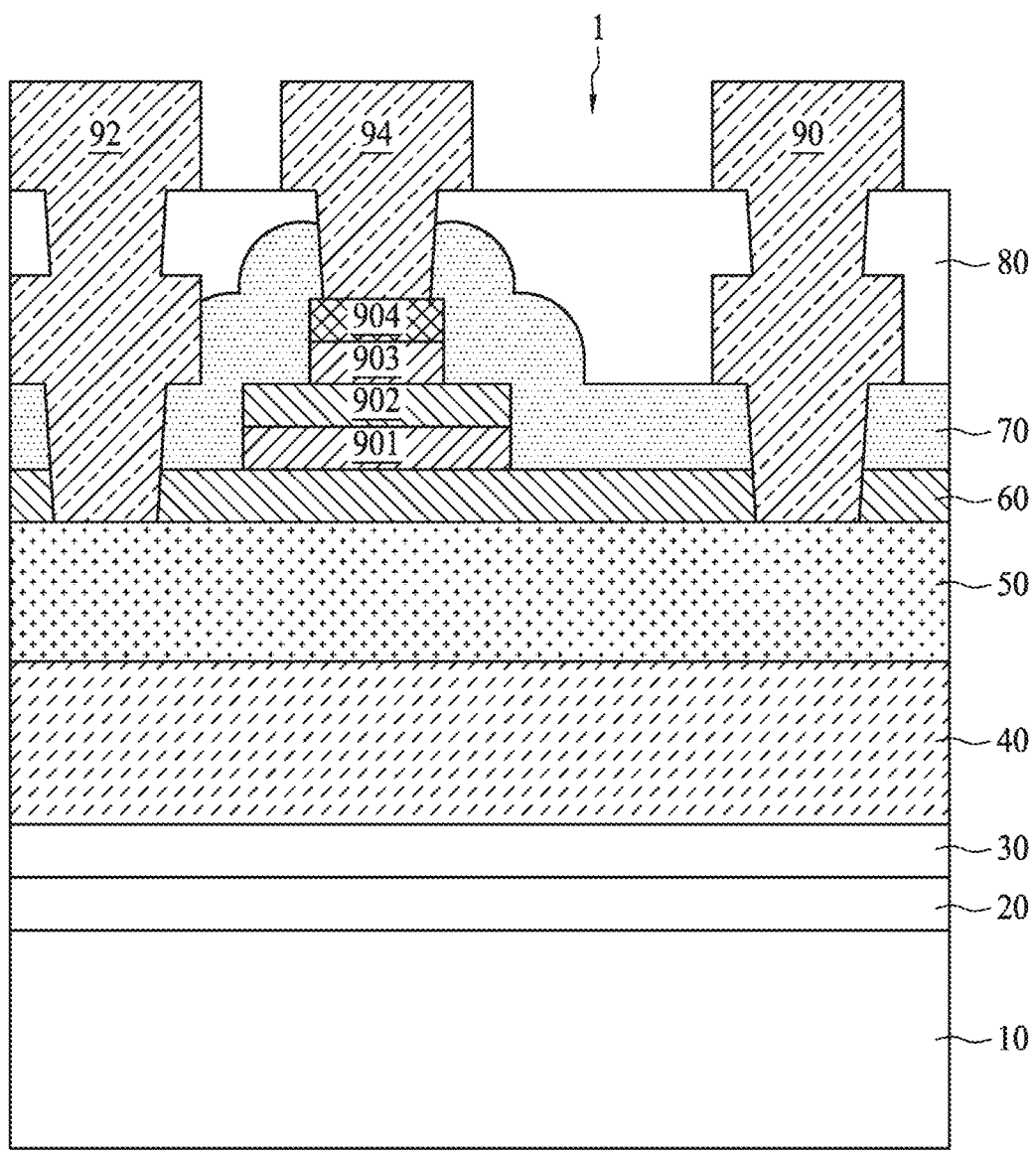
FIG. 1 is a cross-sectional view of a semiconductor apparatus according to some embodiments of the present disclosure.

The following disclosure provides many different embodiments or examples for implementing different features of the provided subject matter. Specific examples of components and arrangements are described below. Certainly, these descriptions are merely examples and are not intended to be limiting. In the present disclosure, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in the present disclosure, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

Group III-V semiconductors such as gallium nitride (GaN) will become the next-generation power semiconductors. Because the group III-V semiconductors have a higher breakdown strength, a faster switching speed, a higher thermal conductivity, and a lower on-resistance (Ron), a power apparatus based on such a wide-bandgap group III-V semiconductor material can greatly outperform conventional silicon (Si)-based power chips. Therefore, GaN-based power apparatuses will play a key role in power conversion markets such as battery chargers, smartphones, calculators, servers, automobiles, lighting systems, and photovoltaic power generation.

FIG. 1 shows a semiconductor apparatus 1 according to some embodiments of the present disclosure.

As shown in FIG. 1, the semiconductor apparatus 1 may include a substrate 10, a seed layer 20, a buffer layer 30, a superlattice electron blocking layer 40, and a channel layer 50, a barrier layer 60, a passivation layer 70, a passivation layer 80, a gate structure, a source contact 92, a drain contact 90, and a conductor structure 94. The gate structure includes a doped group III-V semiconductor 901, a group III-V semiconductor 902, a doped group III-V semiconductor 903, and a conductor 904.

The substrate 10 may include, but is not limited to, silicon (Si), doped silicon (doped Si), silicon carbide (SiC), silicon germanium (SiGe), gallium arsenide (GaAs), or other semiconductor materials. The substrate 10 may include, but is not limited to, sapphire, silicon on insulator (SOI), or other appropriate materials.

The seed layer 20 is disposed on the substrate 10. In some embodiments, the seed layer 20 may include, but is not limited to, a nitride or an oxide or an oxynitride that includes a metal compound, for example, tantalum nitride (TaN), titanium nitride (TiN), tungsten carbide WC), aluminum nitride ($Al_2O_3$), and aluminum oxynitride (AlON).

In some embodiments, the semiconductor apparatus 1 may further include a buffer layer 30 disposed on the seed layer 20. The buffer layer 30 may be disposed between the substrate 10 and the channel layer 50. In some embodiments, the buffer layer 30 may be configured to improve lattice match between the substrate 10, the seed layer 20, and the superlattice electron blocking layer 40. In some embodiments, the buffer layer 30 may include, but is not limited to, a nitride such as aluminum nitride (AlN) and aluminum gallium nitride (AlGaN).

The semiconductor apparatus 1 may further include a superlattice electron blocking layer 40 disposed on the buffer layer 30. The superlattice electron blocking layer 40 may be located between the channel layer 50 and the substrate 10. The channel layer 50 may include a single-layer structure.

The superlattice electron blocking layer 40 may include a single-layer structure. The superlattice electron blocking layer 40 may include a multi-layer structure or a multi-layer stack, such as a multi-layer stack of AlN/GaN pairs. In some embodiments, the superlattice electron blocking layer 40 can reduce a tensile stress of the semiconductor apparatus 1. In some embodiments, the superlattice electron blocking layer 40 may trap electrons diffused from the substrate 10 to the channel layer 50, thereby improving performance and reliability of the apparatus.

In some embodiments, the superlattice electron blocking layer 40 can reduce electron trapping. In some embodiments, the superlattice electron blocking layer 40 may increase a breakdown voltage.

Because the superlattice electron blocking layer 40 can block diffusion of crystallographic defects (such as dislocation) generated in a relatively high voltage environment (for example, with a voltage higher than 200 volts (V)), the superlattice electron blocking layer 40 is disposed in the semiconductor apparatus 1.

In some embodiments, the semiconductor apparatus 1 may further include a channel layer 50 disposed on the superlattice electron blocking layer 40. In some embodiments, the channel layer 50 may include a group III-V layer, for example, but not limited to, a group III-V nitride such as a compound GaN. The GaN may have a bandgap of approximately 3.4 V. The channel layer 50 may have an electronic channel region. In some embodiments, the channel layer 50 may include a single-layer structure. The channel layer 50 may include a multi-layer structure. The channel layer 50 may include a heterostructure.

In some embodiments, the semiconductor apparatus 1 may further include a barrier layer 60 disposed on the channel layer 50. The barrier layer 60 may include a group III-V layer. The barrier layer 60 may include, but is not limited to, a group III nitride such as a compound aluminum gallium nitride ($Al_xGa_{1-x}N$), where x=0.05-0.3. In some embodiments, the barrier layer 60 may include other epitaxially grown nitrides, for example, but not limited to, indium aluminum gallium nitride (InAlGaN) or indium aluminum nitride (InAlN) alloys. The barrier layer 60 may have a larger bandgap than the channel layer 50. A thickness of the barrier layer 60 is between, but not limited to, approximately 5-50 nanometers (nm).

In some embodiments, the semiconductor apparatus 1 may further include a gate structure disposed on the barrier layer 60. The gate structure may include a doped group III-V semiconductor 901, a group III-V semiconductor 902, a doped group III-V semiconductor 903, and a conductor 904. In some embodiments, the doped group III-V semiconductor 901 may include, but is not limited to, a p-type dopant or other dopants. In some embodiments, the doped group III-V semiconductor 901 may be P-type doped gallium nitride (GaN), doped aluminum gallium nitride (doped AlGaN), doped indium gallium nitride (doped InGaN), or another doped group III-V compound. The doped group III-V semiconductor 901 may be a p-type doped group III-V semiconductor formed by doping with magnesium (Mg) or another appropriate dopant. In some embodiments, the thickness of the doped group III-V semiconductor 901 is approximately 3-80 nm.

In some embodiments, the semiconductor apparatus 1 may further include a group III-V semiconductor 902 disposed on the doped group III-V semiconductor 901. In some embodiments, a horizontal width of the group III-V semiconductor 902 is substantially the same as a horizontal width of the first doped group III-V semiconductor 901. In some embodiments, the group III-V semiconductor 902 may be aluminum gallium nitride ($Al_xGa_{1-x}N$), where x=0-1. In some embodiments, a thickness of the group III-V semiconductor 902 is approximately 1-30 nm.

In some embodiments, the semiconductor apparatus 1 may further include a doped group III-V semiconductor 903 disposed on the group III-V semiconductor 902. In some embodiments, the doped group III-V semiconductor 903 may include, but is not limited to, a p-type dopant or other dopants. In some embodiments, the doped group III-V semiconductor 903 may be P-type doped gallium nitride (GaN), doped aluminum gallium nitride (doped AlGaN), doped indium gallium nitride (doped InGaN), or another doped group III-V compound. The doped group III-V semiconductor 903 may be a p-type doped group III-V semiconductor formed by doping with magnesium or another appropriate dopant. In some embodiments, the thickness of the doped group III-V semiconductor 903 is approximately 3-80 nm.

In some embodiments, the semiconductor apparatus 1 may further include a conductor 904 disposed on the doped group III-V semiconductor 903. In some embodiments, the conductor 904 may include, but is not limited to, titanium (Ti), tantalum (Ta), tungsten (W), aluminum (Al), cobalt (Co), copper (Cu), nickel (Ni), platinum (Pt), lead (Pb), molybdenum (Mo), or a compound thereof (for example, but not limited to, titanium nitride (TiN), tantalum nitride (TaN), other conductive nitrides, or conductive oxides, or metal alloys (such as aluminum-copper alloy (Al—Cu)), or other appropriate materials.

In some embodiments, a horizontal width of the doped group III-V semiconductor 901 may be greater than a horizontal width of the conductor 904. In some embodiments, the doped group III-V semiconductor 903 is disposed between the group III-V semiconductor 902 and the conductor 904. In some embodiments, a horizontal width of the doped group III-V semiconductor 903 may be substantially the same as the horizontal width of the conductor 904. In some embodiments, the horizontal width of the doped group III-V semiconductor 901 may be substantially the same as the horizontal width of the group III-V semiconductor 902. In some embodiments, the horizontal widths of the doped group III-V semiconductor 901 and the group III-V semiconductor 902 are greater than the horizontal widths of the doped group III-V semiconductor 903 and the conductor 904.

In the group III-V semiconductor apparatus, achieving a low gate leakage current is still a big challenge. Reducing a leakage current can improve reliability and electrical performance of the apparatus. Due to poor quality of p-GaN and an interface between the p-GaN and the passivation layer, a gate leakage current path is mainly dominated by p-GaN sidewalls (for example, the tops of and an adjacent part between the group III-V semiconductor 903 and the group III-V semiconductor 901). Therefore, a linchpin of reducing the gate leakage current is to improve interface quality through surface cleaning or a passivation and deposition process.

A passivation interface between the group III-V semiconductor 902 (such as aluminum gallium nitride ($Al_xGa_{1-x}N$)) and the passivation layer 70 is better, and therefore, in some embodiments, laminates of the doped group III-V semiconductor 901, the group III-V semiconductor 902, and the group III-V semiconductor 903 may be used to reduce the gate leakage current. Specifically, with the structure of the group III-V semiconductor 902, a contact area between the doped group III-V semiconductor 901 and the passivation layer 70, and a contact layer between the doped group III-V semiconductor 903 and the passivation layer are smaller, and the leakage current of the semiconductor apparatus 1 is lower. In some embodiments, the doped group III-V semiconductor 901, the doped group III-V semiconductor 903, and the group III-V semiconductor 902 may be replaced with other appropriate group III-V semiconductors.

In some embodiments, the semiconductor apparatus 1 may further include a source contact 92, a drain contact 90, and a conductor structure 94. The source contact 92 and the drain contact 90 are disposed on the channel layer 50, and are respectively disposed on two sides of the conductor 904 and the conductor structure 94, but the source contact 92 and the drain contact 90 may be configured differently in other embodiments of the present disclosure depending on design requirements. The conductor structure 94 is disposed on the conductor 904.

In some embodiments, the source contact 92, the drain contact 90, and the conductor structure 94 may include, but is not limited to, a conductor material. The conductor material may include, but is not limited to, a metal, an alloy, a doped semiconductor material (such as a doped crystalline silicon) or another appropriate conductor material.

In some embodiments, the semiconductor apparatus 1 may further include a passivation layer 70 disposed on the barrier layer 60. The passivation layer 70 may cover the barrier layer 60. In some embodiments, the passivation layer 70 covers the doped group III-V semiconductor 901, the group III-V semiconductor 902, the doped group III-V semiconductor 903, the conductor 904, and the conductor structure 94. In some embodiments, the passivation layer 70 may surround a part of the source contact 92, the drain contact 90, and the conductor structure 94.

In some embodiments, the passivation layer 70 may include, but is not limited to, oxides or nitrides, such as silicon nitride ($Si_3N_4$), silicon oxide (SiO2), and the like. The passivation layer 70 may include, but is not limited to, a composite layer of oxide and nitride, such as $Al_2O_3/SiN$, $Al_2O_3/SiO_2$, AlN/SiN, and $AlN/SiO_2$.

In some embodiments, the semiconductor apparatus 1 may further include a passivation layer 80 disposed on the passivation layer 70. In some embodiments, the passivation layer 80 may cover the passivation layer 70. In some embodiments, the passivation layer 80 may cover a part of the source contact 92, the drain contact 90, and the conductor structure 94. In some embodiments, the passivation layer 80 may surround a part of the source contact 92, the drain contact 90, and the conductor structure 94. In some embodiments, the passivation layer 80 may include, but is not limited to, oxides or nitrides, such as silicon nitride ($Si_3N_4$), silicon oxide ($SiO_2$), and the like. The passivation layer 80 may include, but is not limited to, a composite layer of oxide and nitride, such as $Al_2O_3/SiN$, $Al_2O_3/SiO_2$, AlN/SiN, and $AlN/SiO_2$.

Figure 2:
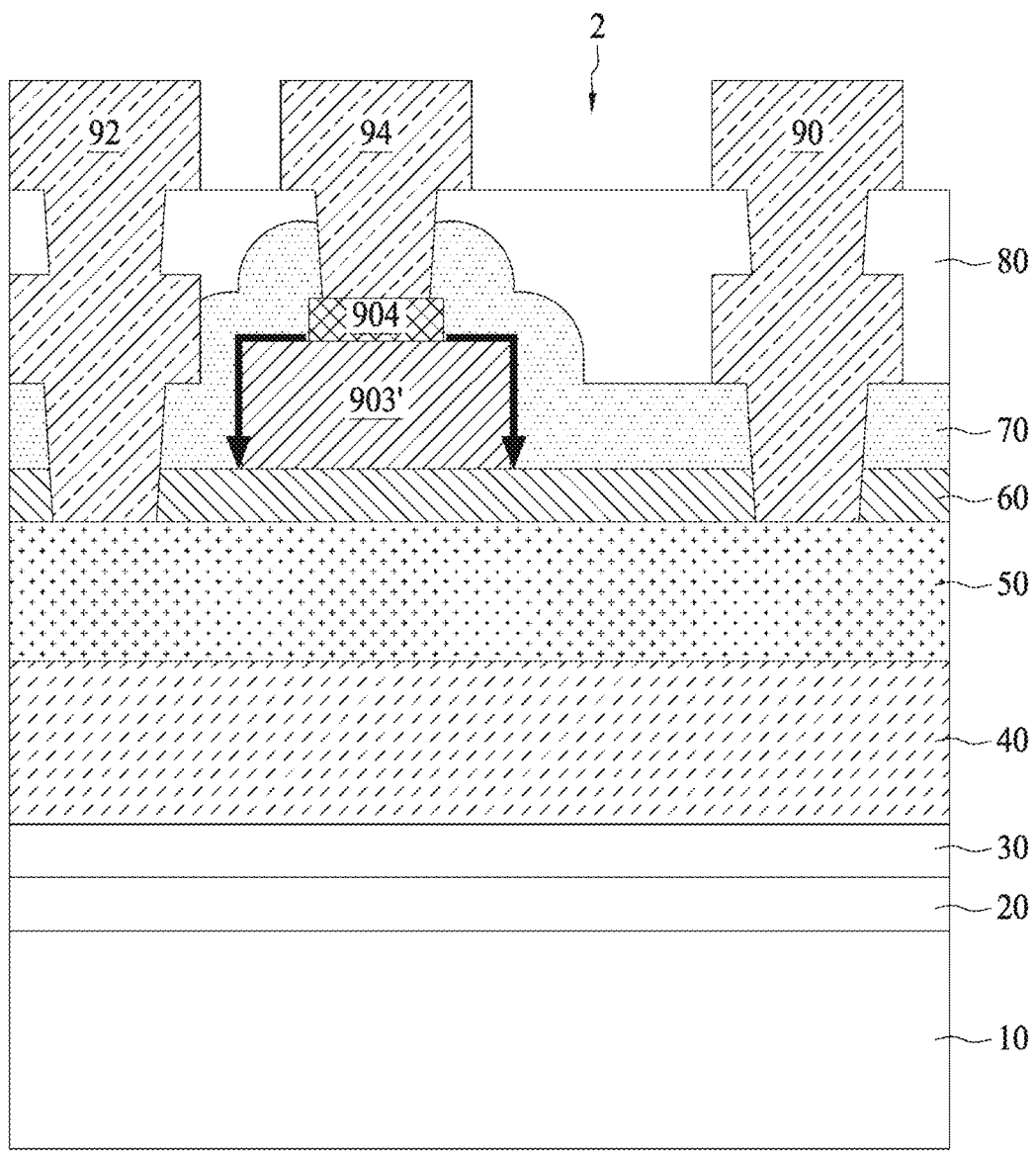
FIG. 2 is a cross-sectional view of a semiconductor apparatus according to some embodiments of the present disclosure.

FIG. 2 shows a semiconductor apparatus 2 according to some embodiments of the present disclosure.

The semiconductor apparatus 2 shown in FIG. 2 may be the same as or similar to the semiconductor apparatus 1 shown in FIG. 1, and one of the differences is that the doped group III-V semiconductor 903' of the semiconductor apparatus 2 is disposed on the barrier layer 60 and that the conductor 904 is disposed on the doped group III-V semiconductor 903'.

As shown in FIG. 2, a horizontal width of the doped group III-V semiconductor 903' is greater than the horizontal width of the conductor 904. In some embodiments, the semiconductor apparatus 2 does not include the doped group III-V semiconductor 901 or the group III-V semiconductor 902. The passivation layer 70 may cover the doped group III-V semiconductor 903' and the conductor 904.

The semiconductor apparatus 2 shown in FIG. 2 has a higher leakage current than the semiconductor apparatus 1 shown in FIG. 1. As shown by the arrow in FIG. 2, a leakage current of a gate flows from an edge of the conductor 904 through an interface between the doped group III-V semiconductor 903' and the passivation layer 70, and finally reaches the barrier layer 60.

A leakage current phenomenon is caused by poor interface quality, and also because the doped group III-V semiconductor 903 has a higher GaO/GaN ratio. Using aluminum gallium nitride ($Al_xGa_{1-x}N$) instead of a part of the doped group III-V semiconductor 903 (for example, P-type doped gallium nitride (GaN)) can reduce Ga—O formed. By using aluminum gallium nitride ($Al_xGa_{1-x}N$), there will be more Al—O. The Al—O can be better bonded to an interface chemically to reduce leakage current on the interface.

By contrast, a passivation interface of the group III-V semiconductor 902 (such as aluminum gallium nitride ($Al_xGa_{1-x}N$)) of the semiconductor apparatus 1 shown in FIG. 1 has fewer defects. Therefore, the gate leakage current can be effectively reduced by adding a layer of group III-V semiconductor 902 between the doped group III-V semiconductor 901 and the doped group III-V semiconductor 903.

FIG. 3A, FIG. 3B, FIG. 3C, FIG. 3D, FIG. 3E, FIG. 3F, FIG. 3G, and FIG. 3H show several operations of fabricating a semiconductor apparatus according to some embodiments of the present disclosure. Although FIG. 3A to FIG. 3H illustrate several operations of fabricating the semiconductor apparatus 1, similar operations may also be performed for fabricating the semiconductor apparatus 2 or the semiconductor apparatuses 5-9.

Figure 3A:
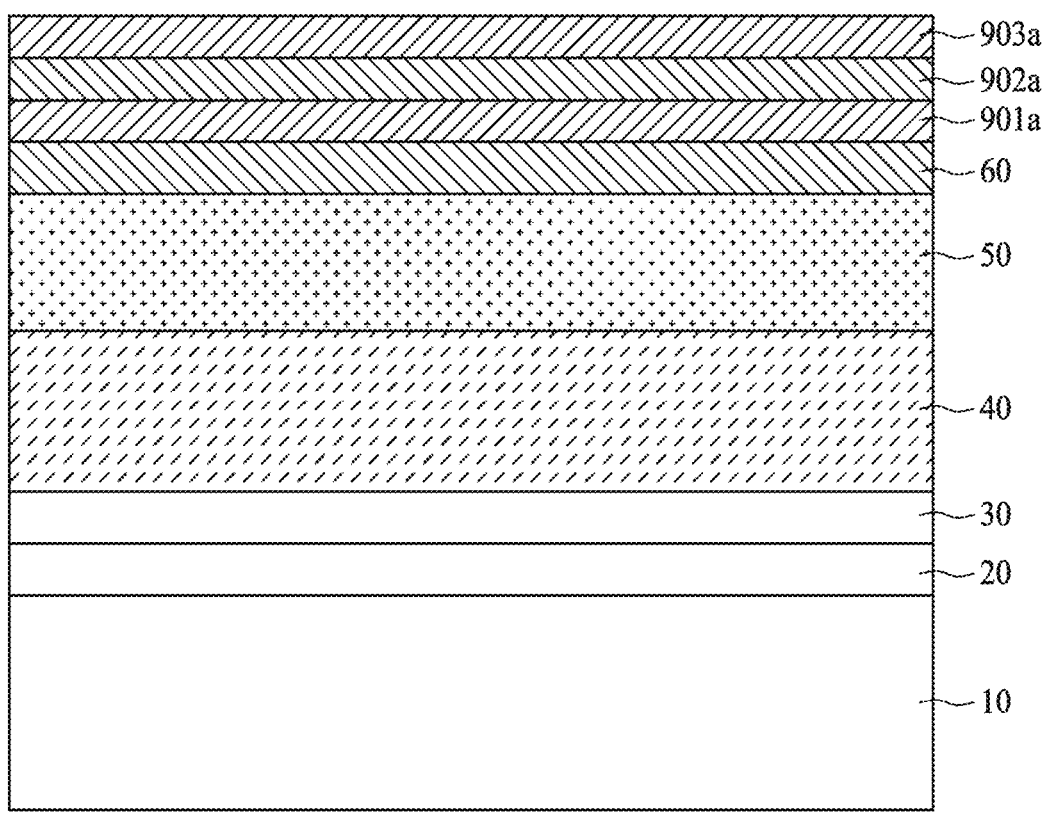
FIG. 3A, FIG. 3B, FIG. 3C, FIG. 3D, FIG. 3E, FIG. 3F, FIG. 3G, and FIG. 3H show several operations of fabricating a semiconductor apparatus according to some embodiments of the present disclosure.

Referring to FIG. 3A, a substrate 10 is provided. In some embodiments, a seed layer 20 is formed on the substrate 10. In some embodiments, a buffer layer 30 is formed on the seed layer 20. The seed layer 20 and the buffer layer 30 may be formed through epitaxial growth of metal organic chemical vapor deposition (MOCVD). In some embodiments, a superlattice electron blocking layer 40 is formed on the buffer layer 30. In some embodiments, a channel layer 50 is disposed on the superlattice electron blocking layer 40 through epitaxial growth. The barrier layer 60 is disposed on the channel layer 50. The barrier layer 60 may be formed, for example, through epitaxial growth of metal organic chemical vapor deposition (MOCVD) or by performing another appropriate deposition step.

The barrier layer 60 is formed on the doped group III-V semiconductor 901a. The doped group III-V semiconductor 901a is formed on the semiconductor layer 902a. The semiconductor layer 902a is formed on the doped group III-V semiconductor 903a. In some embodiments, the doped group III-V semiconductor 901a, the semiconductor layer 902a, and the doped group III-V semiconductor 903a may be formed by through epitaxial growth of metal organic chemical vapor deposition (MOCVD), and doped with a dopant.

Figure 3B:
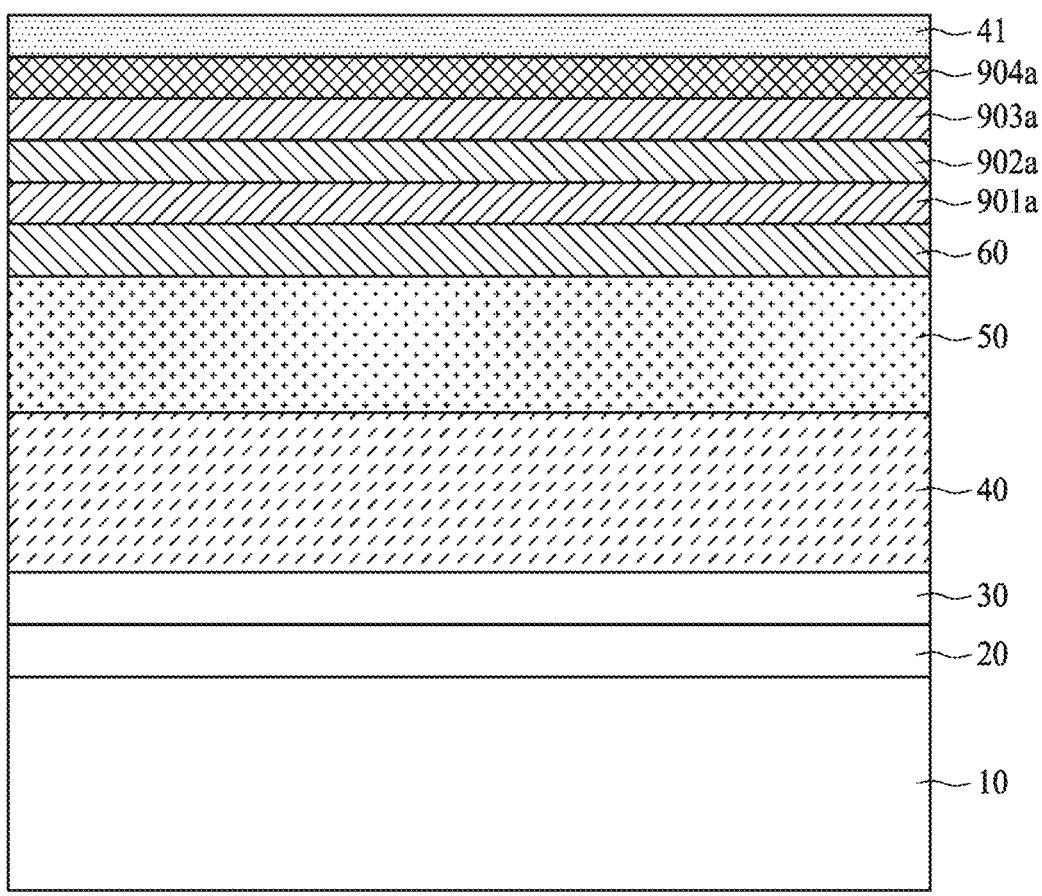

Referring to FIG. 3B, the conductor layer 904a and a hard mask 41 are formed on the doped group III-V semiconductor 903a. The conductor layer 904a may be formed through physical vapor deposition (PVD), chemical vapor deposition (CVD), atomic layer deposition (ALD), plating, and/or another appropriate deposition step. In some embodiments, the hard mask 41 may include, but is not limited to, silicon nitride ($Si_3N_4$), silicon oxynitride (SiON), and silicon carbide (SiC). The hard mask 41 is configured to pattern the doped group III-V semiconductor 903a and the conductor layer 904a through processes such as photolithography and etching. In some embodiments, the etching step may be performed using dry etching, wet etching, or a combination of dry etching and wet etching.

Figure 3C:
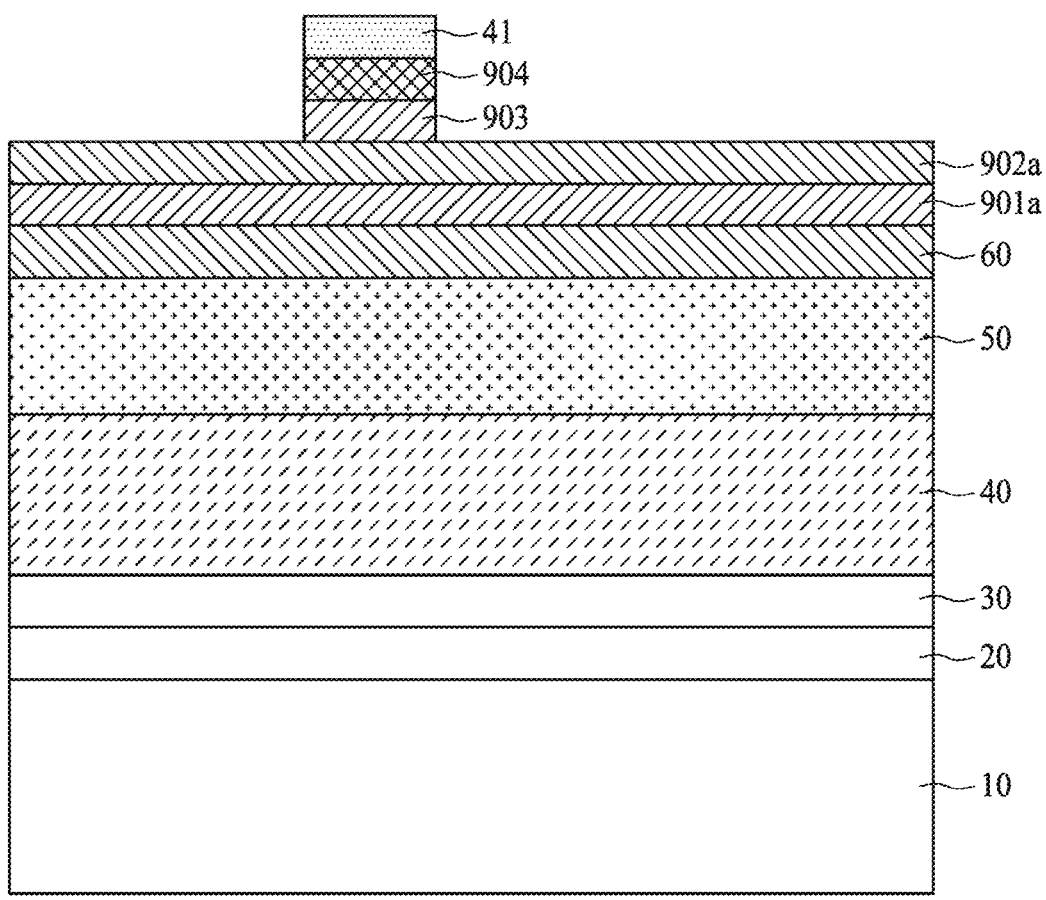

Referring to FIG. 3C, a part of the doped group III-V semiconductor 903a and the conductor layer 904a may be removed from above the semiconductor layer 902a by photolithography, so as to form the doped group III-V semiconductor 903 and the conductor 904.

Figure 3D:
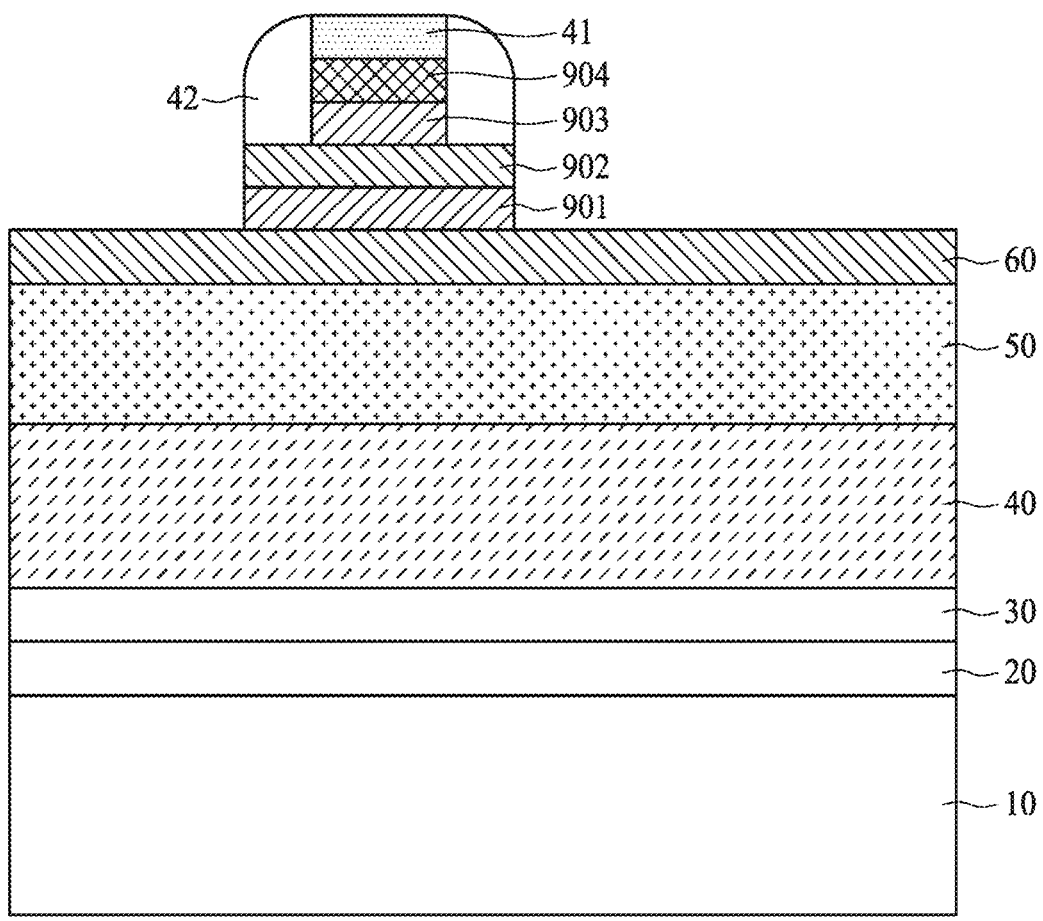

Referring to FIG. 3D, a patterned photoresist 42 is formed on both sides of the hard mask 41, the doped group III-V semiconductor 903a, and the conductor layer 904a separately to cover the semiconductor layer 902a. After a part of the doped part III-V semiconductor 901a and the semiconductor layer 902a is removed, the doped group III-V semiconductor 901 and the group III-V semiconductor 902 are formed. Due to the patterned photoresist 42, the widths of the doped group III-V semiconductor 901 and the group III-V semiconductor 902 are greater than the widths of the doped group III-V semiconductor 903a and the conductor layer 904a.

Figure 3E:
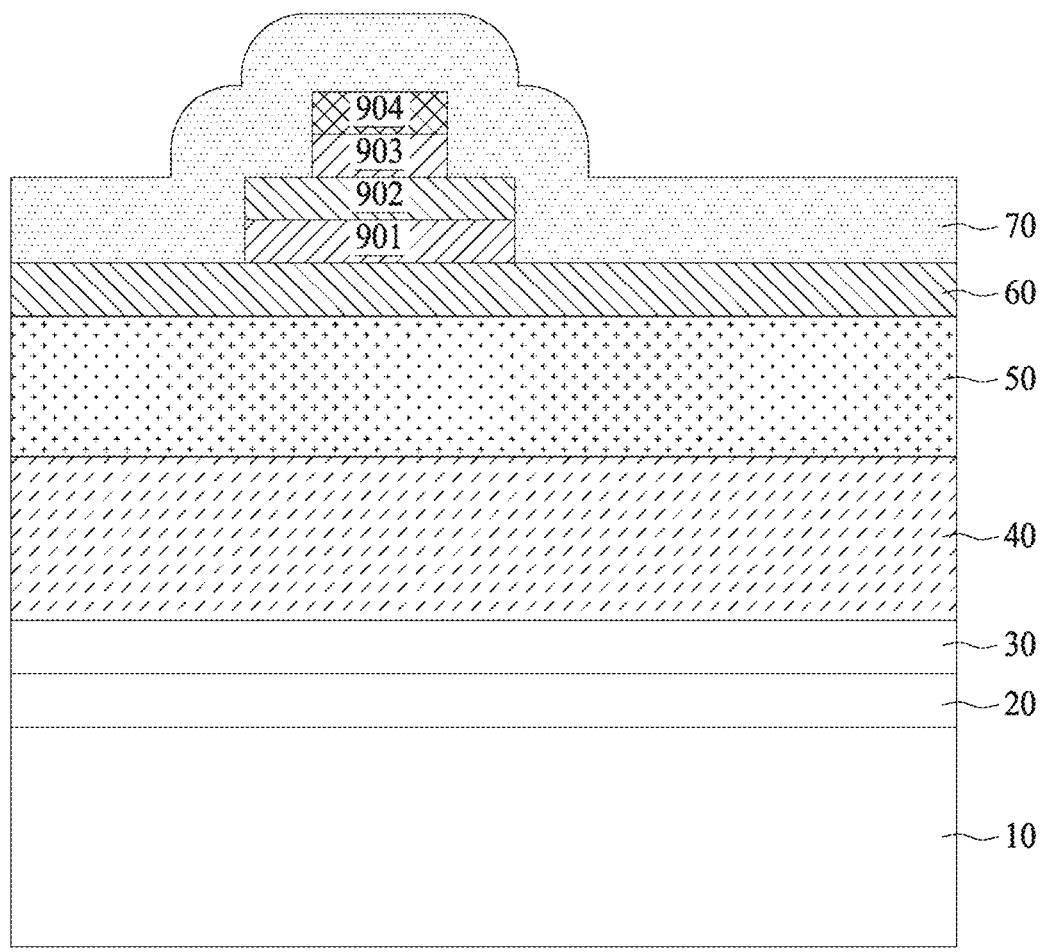

Referring to FIG. 3E, after the hard mask 41 and the patterned photoresist 42 are removed, a passivation layer 70 is formed to cover the doped group III-V semiconductor 901, the group III-V semiconductor 902, the doped group III-V semiconductor 903, and the conductor 904.

Figure 3F:
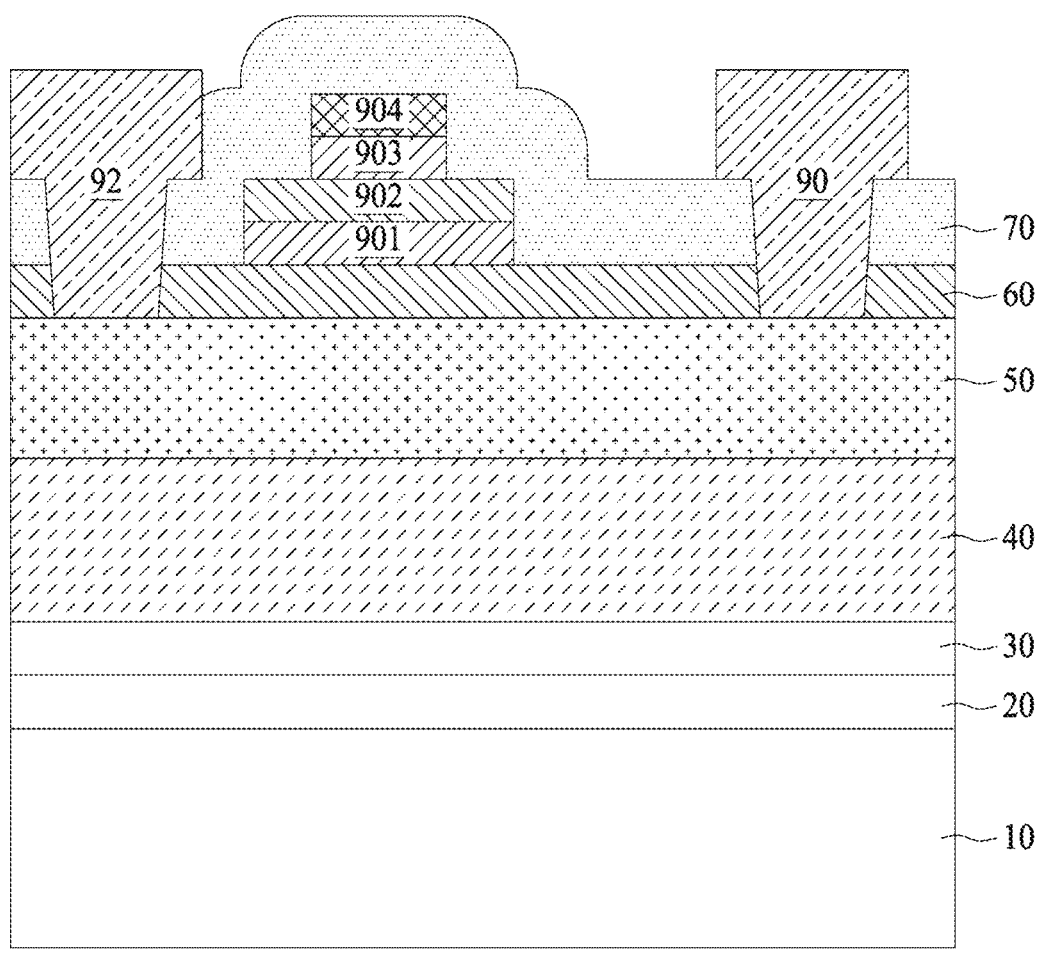

Referring to FIG. 3F, source contact holes and drain contact holes are formed in the passivation layer 70 and the barrier layer 60, and filled with materials to form a source contact 92 and a drain contact 90. In some embodiments, this involves multiple steps, including photolithography, etching, deposition, and the like. In some embodiments, the source contact 92 and the drain contact 90 may be formed through physical vapor deposition (PVD), chemical vapor deposition (CVD), atomic layer deposition (ALD), plating, and/or another appropriate deposition step.

Figure 3G:
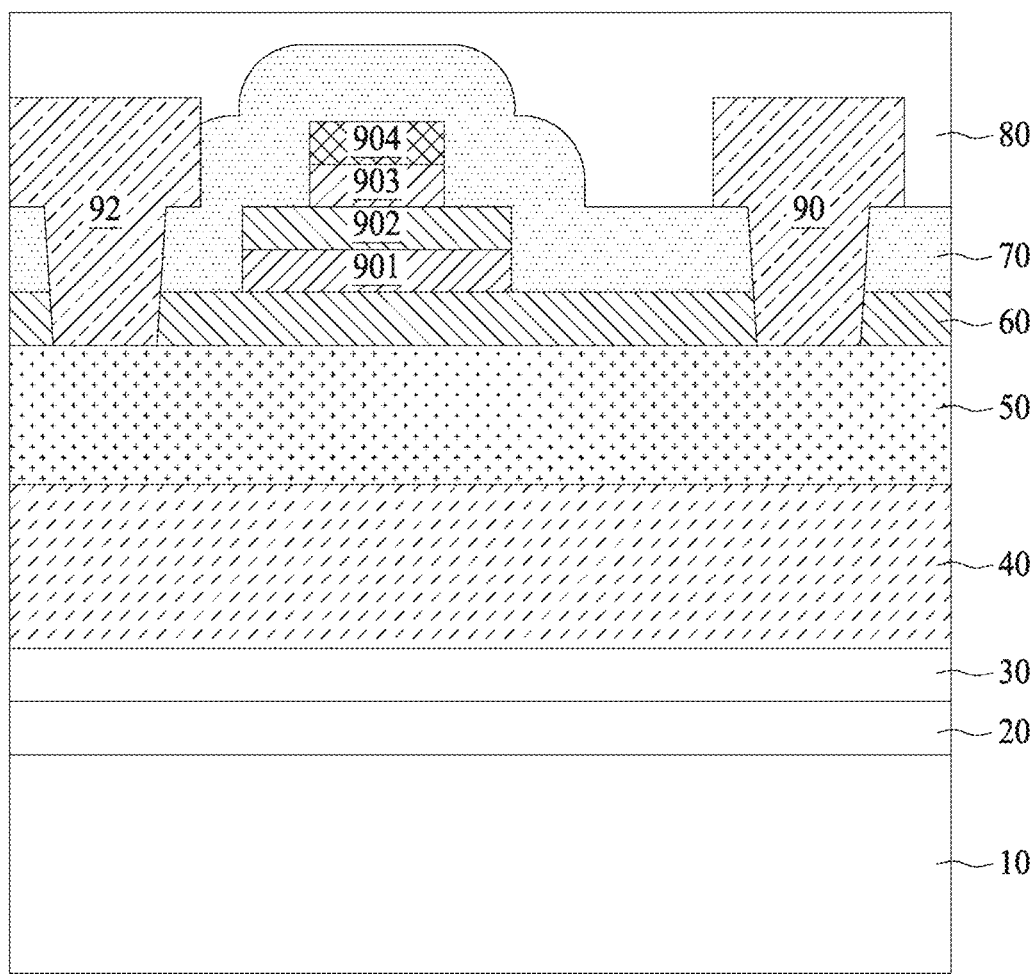

Referring to FIG. 3G, the formed passivation layer 80 covers the doped group III-V semiconductor 901, the group III-V semiconductor 902, the doped group III-V semiconductor 903, and the conductor 904. In some embodiments, the passivation layer 80 may be deposited by CVD, high density plasma (HDP) CVD, spin-on, sputtering, or the like. Subsequently, a surface of the passivation layer 80 is treated through chemical-mechanical planarization (CMP).

Figure 3H:
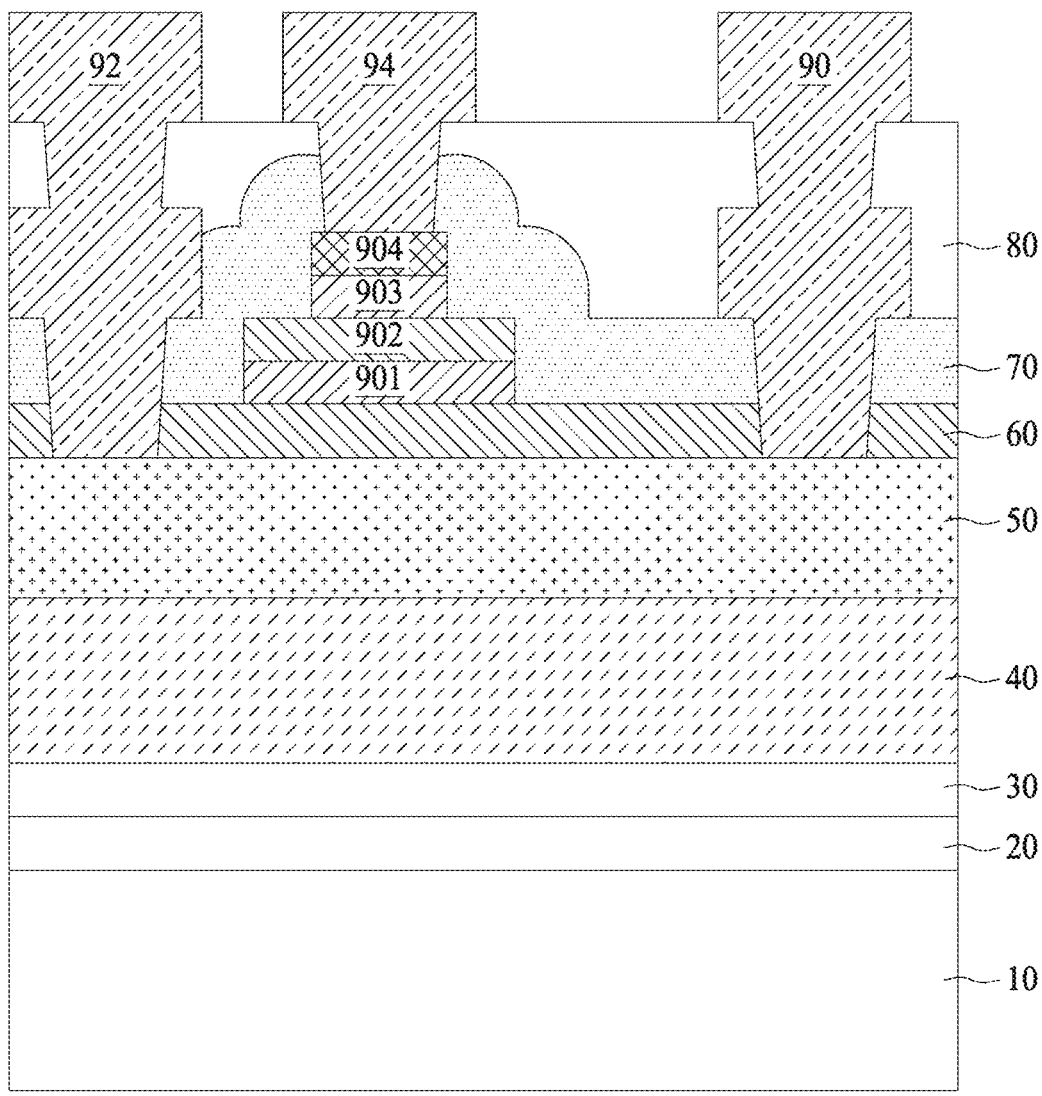

Referring to FIG. 3H, source contact holes and drain contact holes are formed in the passivation layers 80 and 70, and filled with materials to form a source contact 92, a drain contact 90, and a conductor structure 94. In some embodiments, the source contact 92, the drain contact 90, and the conductor structure 94 may be of the same material. In some embodiments, this involves multiple steps, including photolithography, etching, deposition, and the like. After the source contact 92, the drain contact 90, and the conductor structure 94 are formed, the fabrication process of the semiconductor apparatus 1 is completed.

Before the passivation layer 70 is formed, an upper surface of the barrier layer 60, sidewalls and a part of upper surfaces of the doped group III-V semiconductor 901 and the group III-V semiconductor 902, and a sidewall of the doped group III-V semiconductor 903 may be pretreated.

TABLE 1

| Sample | Pretreatment | $V_{TH}$ (V) | $\Delta V_1$ (V) | $\Delta V_2$ (V) | Ga—O(N)/ Ga—N (%) |
|---|---|---|---|---|---|
| A | Natural oxide | −10.5 | 0 | 0.13 | 8.7 |
| B | Oxygen annealing | −7.2 | 0.08 | 0.67 | 48.7 |
| C | N2 plasma | −8.7 | 0.7 | 0.2 | 8.7 |
| D | FG plasma | −8.1 | 0.5 | 0.18 | 5.3 |

Table 1 shows electrical performance after different pretreatments are performed. In some embodiments, the pretreatments include oxygen annealing pretreatment or N2 or FG plasma pretreatment. As can be seen from Table 1, after different pretreatments are performed, surface defect density of the samples varies. The sample D forms the least Ga—O at an interface after being pretreated, and therefore, has the least interface defects. In some embodiments, the pretreatment may be performed during the operations in FIG. 3C or FIG. 3D.

Figure 4A:
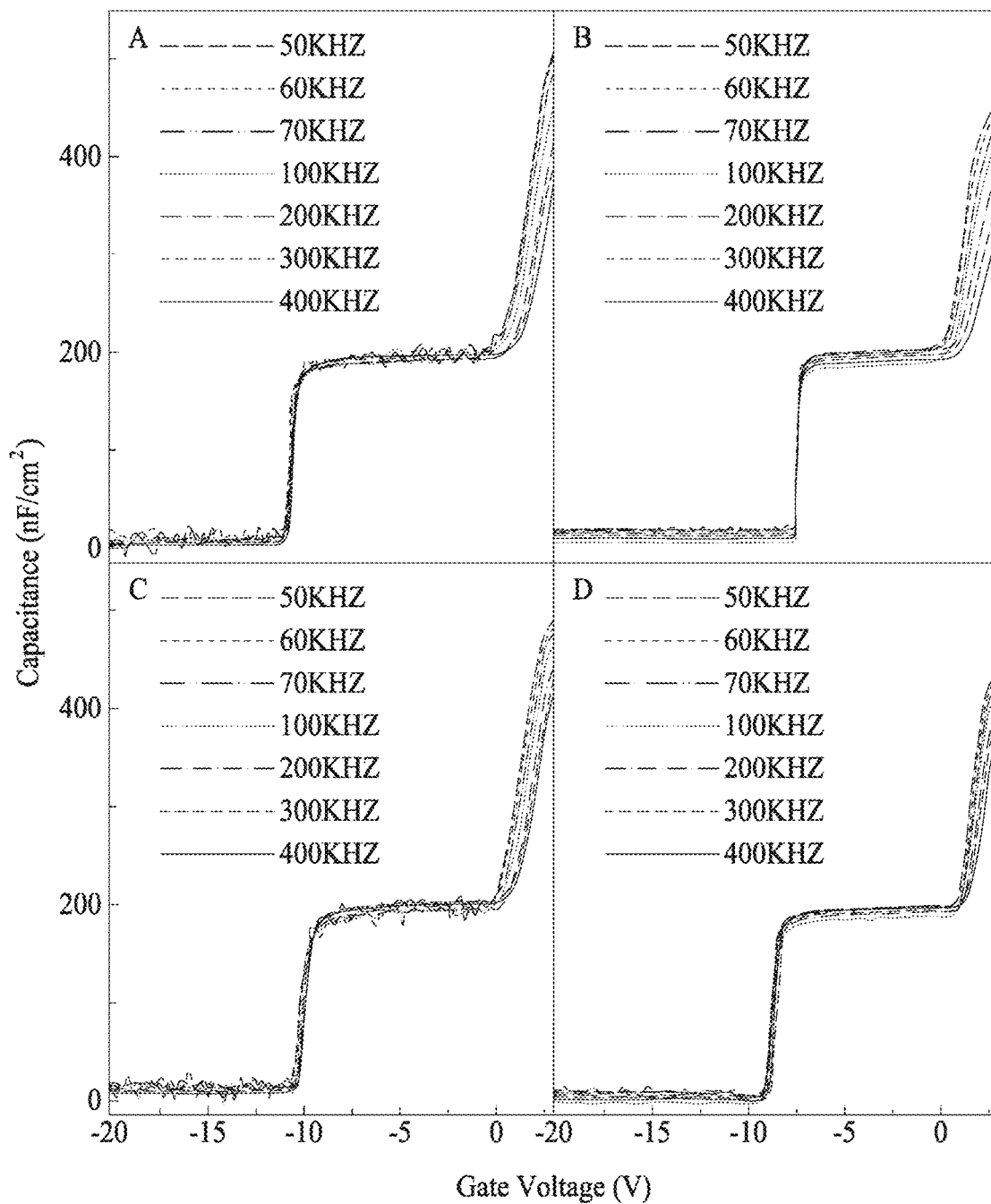
FIG. 4A shows capacitance-voltage characteristics of a semiconductor apparatus according to some embodiments of the present disclosure.

FIG. 4A shows capacitance-voltage characteristics of a semiconductor apparatus according to some embodiments of the present disclosure. Specifically, FIG. 4A is a capacitance-voltage characteristic diagram of the pretreated semiconductor apparatus corresponding to Table 1. The characteristic diagram of the sample A shown in FIG. 4A is a capacitance-voltage characteristic diagram in which the upper surface of the barrier layer 60, the sidewall of the doped group III-V semiconductor 901/group III-V semiconductor 902, and the sidewall of the doped group III-V semiconductor 903 are subjected to only a natural oxide pretreatment. The characteristic diagram of the sample B shown in FIG. 4A shows a circumstance in which the upper surface of the barrier layer 60, the sidewall of the doped group III-V semiconductor 901/group III-V semiconductor 902, and the sidewall of the doped group III-V semiconductor 903 are subjected to an oxygen annealing pretreatment. The characteristic diagram of the sample C shown in FIG. 4A shows a circumstance in which the upper surface of the barrier layer 60, the sidewall of the doped group III-V semiconductor 901/group III-V semiconductor 902, and the sidewall of the doped group III-V semiconductor 903 are subjected to N2 plasma pretreatment. The characteristic diagram of the sample D shown in FIG. 4A shows a circumstance in which the upper surface of the barrier layer 60, the sidewall of the doped group III-V semiconductor 901/group III-V semiconductor 902, and the sidewall of the doped group III-V semiconductor 903 are subjected to FG plasma pretreatment.

The characteristic diagram of each sample in FIG. 4A shows whether $V_{TH}$ greatly disperses or varies with different frequencies when the voltage is above 0. As can be seen from the characteristic diagram of the sample D in FIG. 4A, the semiconductor apparatus subjected to an FG plasma pretreatment at frequencies of 50-400 kHz shows small dispersion, indicating that the upper surface of barrier layer 60, the sidewall of the doped group III-V semiconductor 901/group III-V semiconductor 902, and the sidewall of the doped group III-V semiconductor 903 of the semiconductor apparatus subjected to the FG plasma pretreatment have few defects. The bonding of Ga—O is less stable than that of Al—O ($Ga_2O_3$ is less stable due to a higher free energy than $Al_2O_3$). Therefore, an interface with Al—O has fewer defects than an interface with G—O. Therefore, with a smaller quantity of G—O, the semiconductor apparatus has a better electrical performance. In some embodiments, a lower value of the Ga—O(N)/Ga—N ratio (and a smaller quantity of Ga—O) in each interface of the barrier layer 60, the doped group III-V semiconductor 901/group III-V semiconductor 902, and the doped group III-V semiconductor 903 indicates less defects in the interface.

Figure 4B:
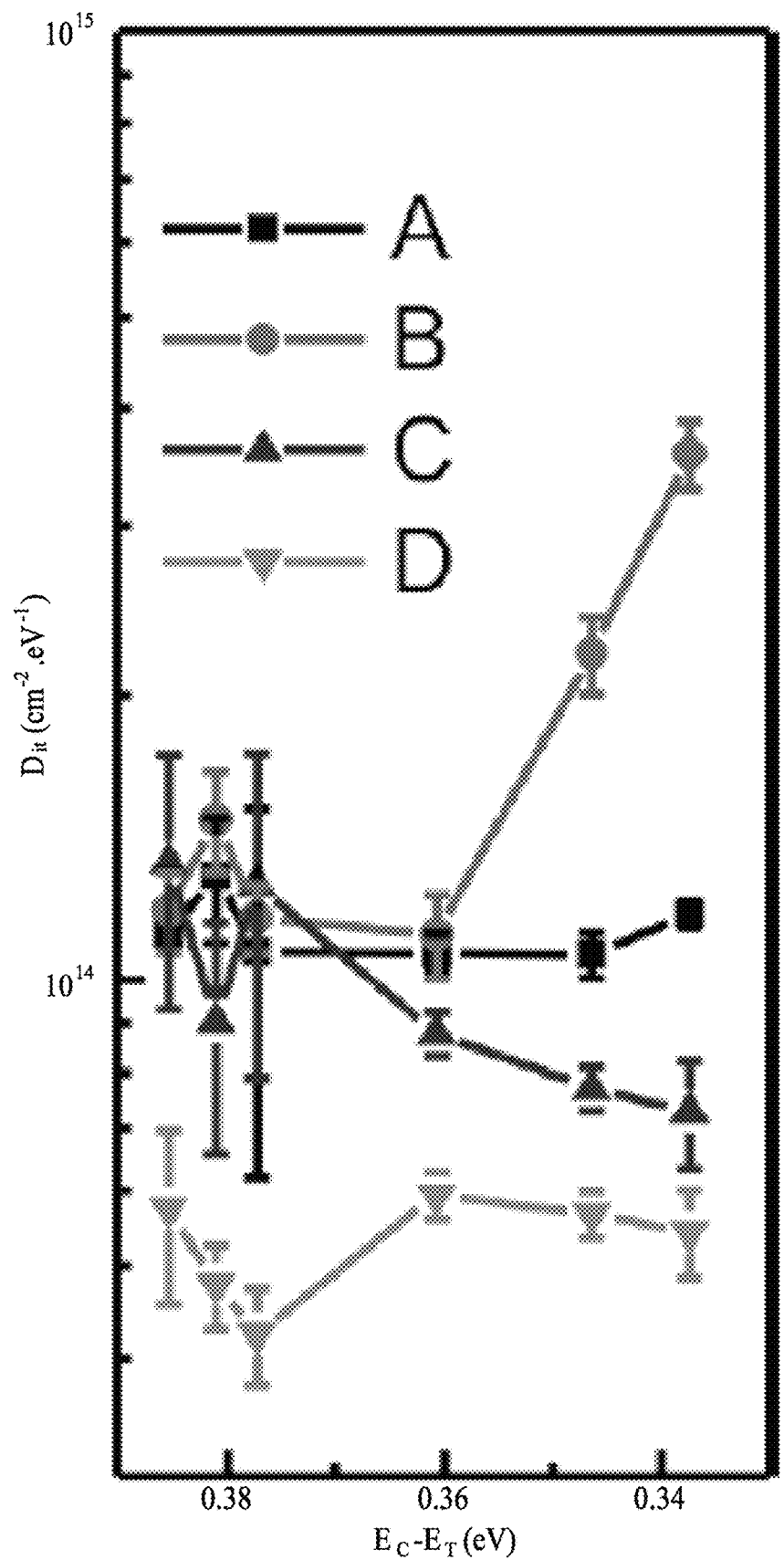
FIG. 4B is an energy band diagram of defect density of a semiconductor apparatus.

FIG. 4B is an energy band diagram of defect density (DO of a semiconductor apparatus. In some embodiments, FIG. 4B shows the defect density of the semiconductor apparatus shown in FIG. 4A. FIG. 4B is the defect density corresponding to GaN band energy and calculated according to a capacitance-voltage result shown in FIG. 4A. The defect density ($D_{it}$) varies between the samples. A lower value of the defect density indicates better electrical performance of the semiconductor apparatus. Similarly, FIG. 4B shows that the sample D has the lowest defect density.

Figure 5:
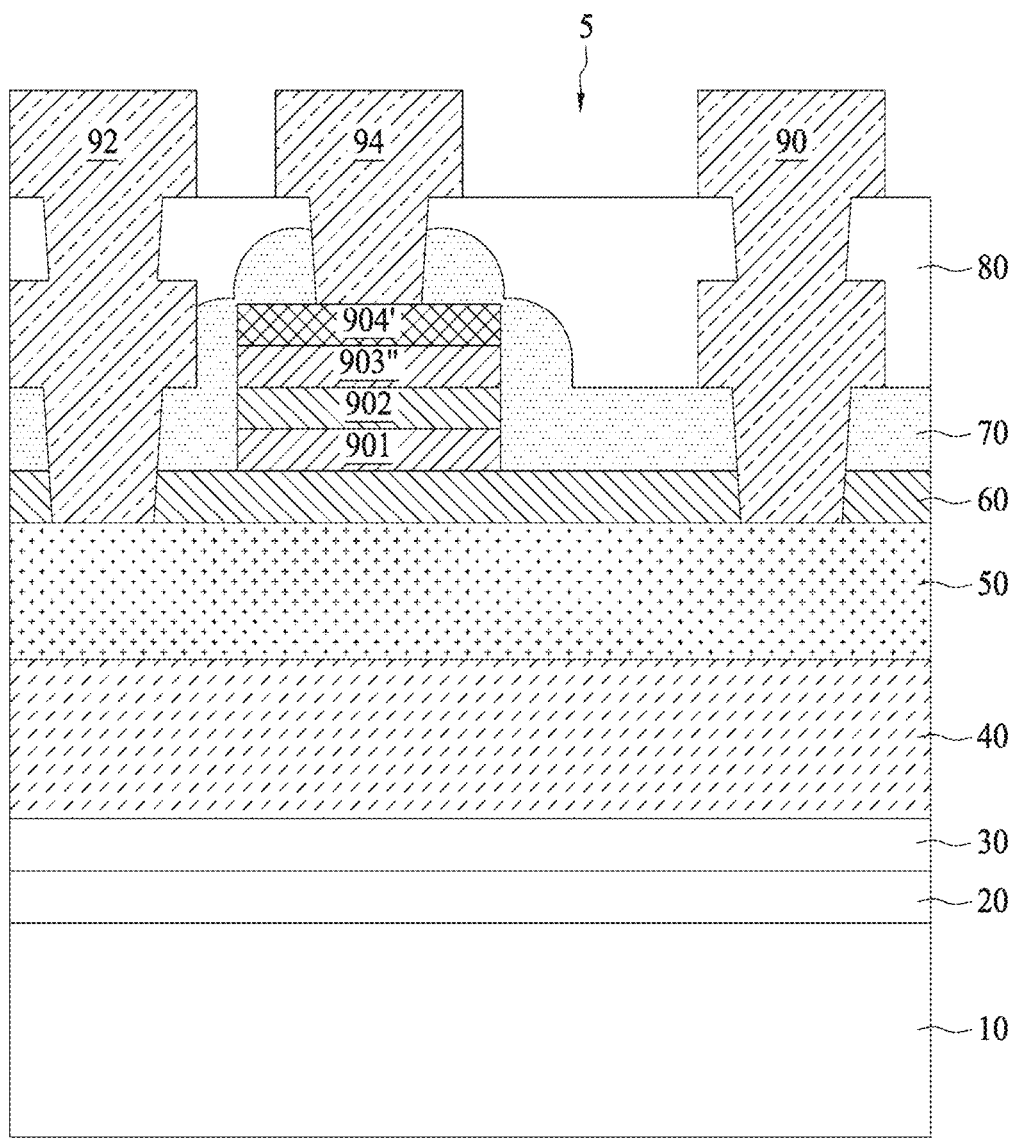
FIG. 5 is a cross-sectional view of a semiconductor apparatus according to some embodiments of the present disclosure.

FIG. 5 shows a semiconductor apparatus 5 according to some embodiments of the present disclosure.

The semiconductor apparatus 5 shown in FIG. 5 may be similar to the semiconductor apparatus 1 shown in FIG. 1, and one of the differences is that the horizontal widths of the conductor 904', the doped group III-V semiconductor 903'', the group III-V semiconductor 902, and the doped group III-V semiconductor 901 of the semiconductor apparatus 5 are substantially the same.

Figure 6:
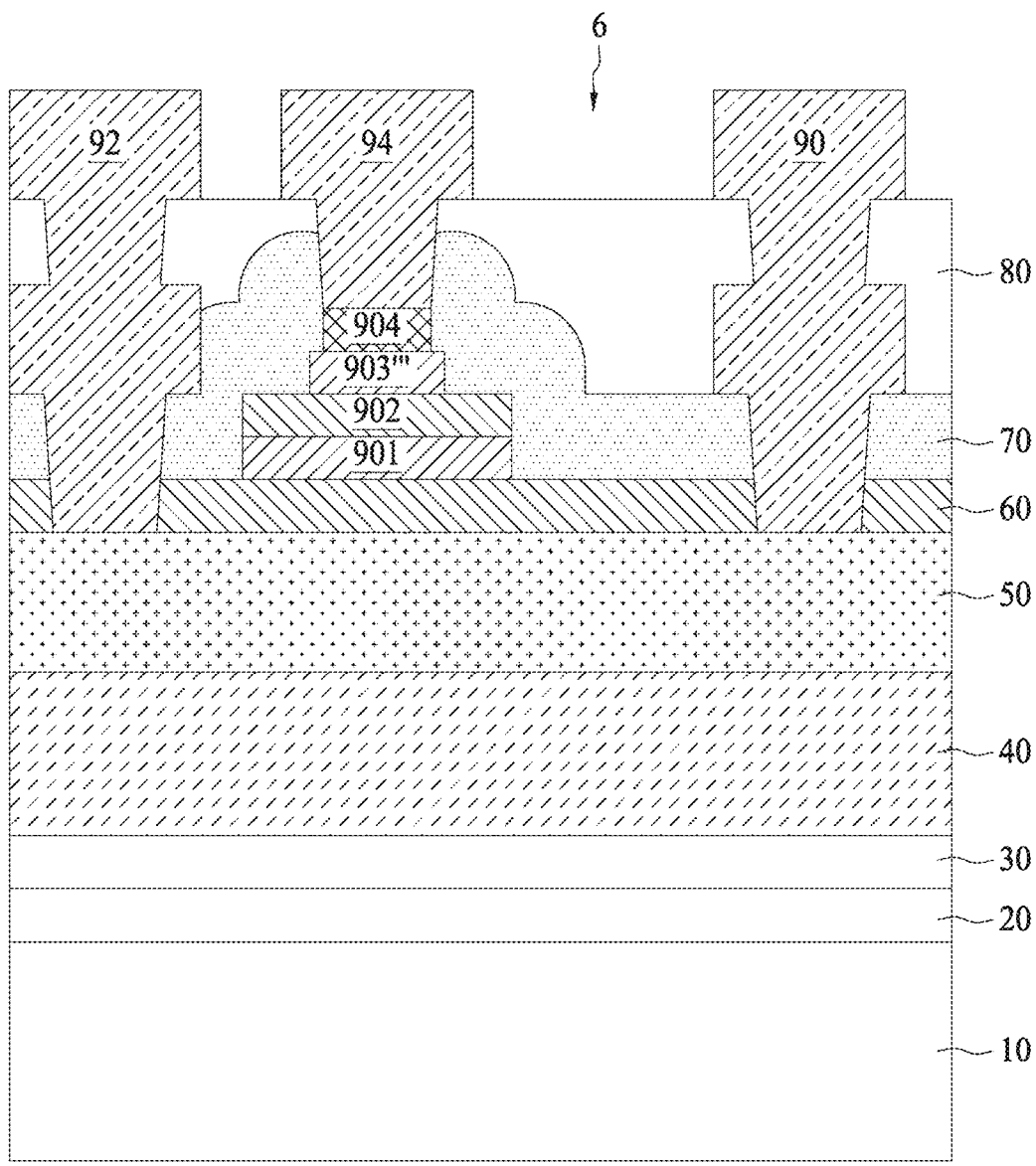
FIG. 6 is a cross-sectional view of a semiconductor apparatus according to some embodiments of the present disclosure.

FIG. 6 shows a semiconductor apparatus 6 according to some embodiments of the present disclosure.

The semiconductor apparatus 6 shown in FIG. 6 may be similar to the semiconductor apparatus 1 shown in FIG. 1. One of the differences is that the horizontal width of the doped group III-V semiconductor 903''' is greater than the horizontal width of the conductor 904.

Figure 7:
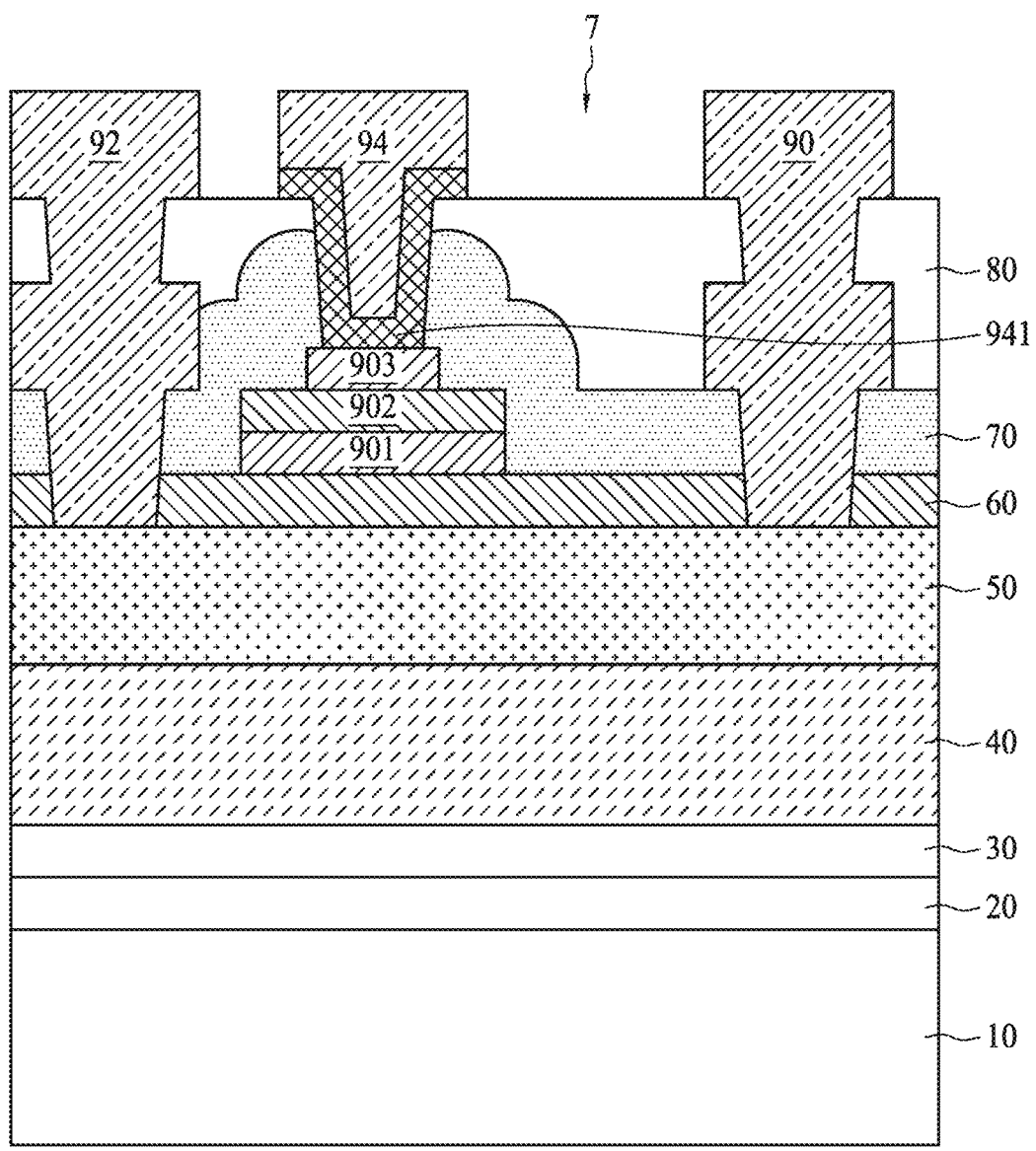
FIG. 7 is a cross-sectional view of a semiconductor apparatus according to some embodiments of the present disclosure.

FIG. 7 shows a semiconductor apparatus 7 according to some embodiments of the present disclosure.

The semiconductor apparatus 7 shown in FIG. 7 may be the same as or similar to the semiconductor apparatus 1 shown in FIG. 1. One of the differences is that the shape of the conductor 941 of the semiconductor apparatus 7 is different from that in FIG. 1, and that the horizontal width of the group III-V semiconductor 903 is greater than the bottom width of the conductor 941. In addition, the passivation layer 70 surrounds a part of the conductor 941 and the passivation layer 80 surrounds a part of the conductor 941. A part of the conductor 941 is disposed on the upper surface of the passivation layer 80.

Figure 8:
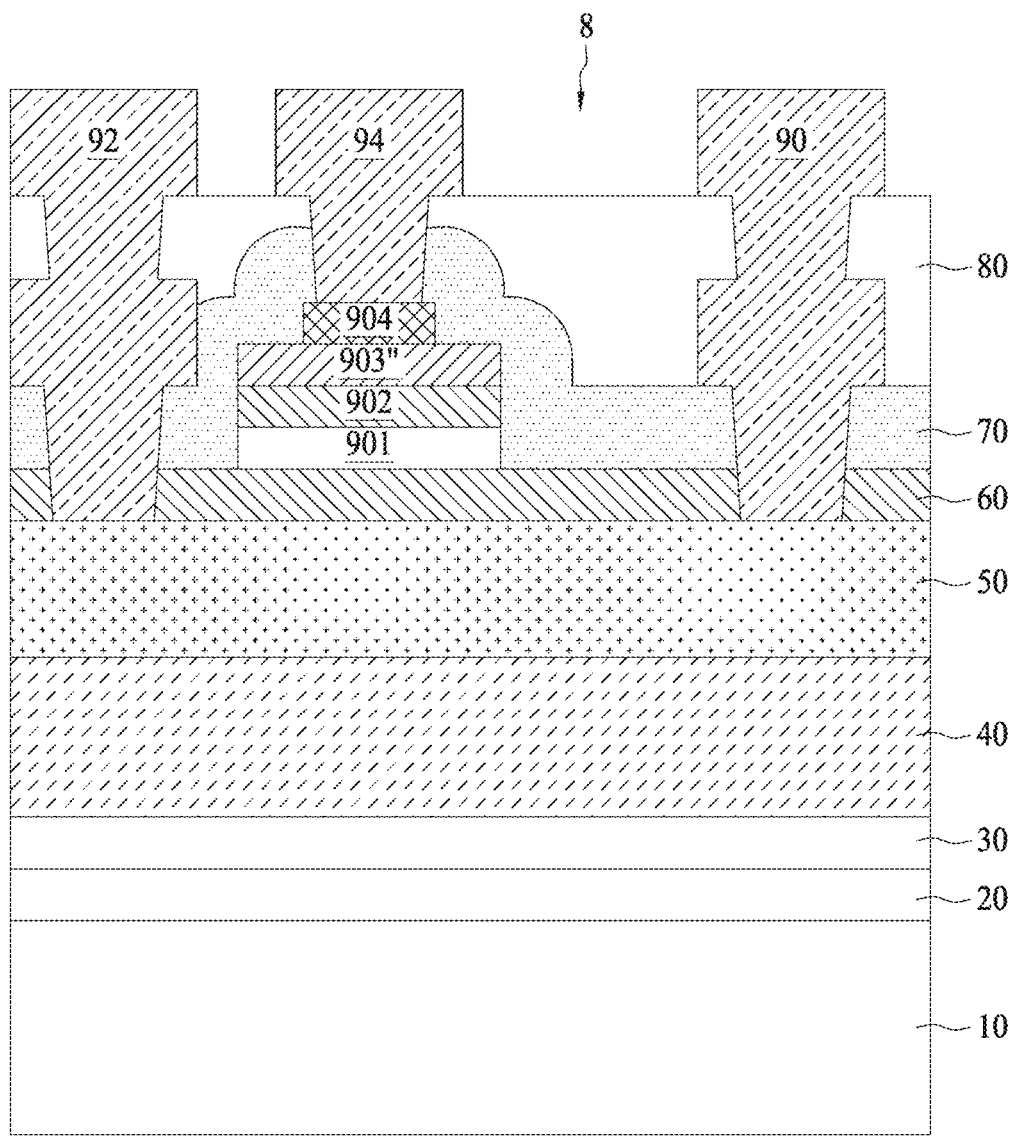
FIG. 8 is a cross-sectional view of a semiconductor apparatus according to some embodiments of the present disclosure.

FIG. 8 shows a semiconductor apparatus 8 according to some embodiments of the present disclosure.

The semiconductor apparatus 8 shown in FIG. 8 may be similar to the semiconductor apparatus 1 shown in FIG. 1, and one of the differences is that the horizontal width of the doped group III-V semiconductor 903'' is substantially the same as the horizontal width of the group III-V semiconductor 902, and that the horizontal width of the doped group III-V semiconductor 903'' is greater than the horizontal width of the conductor 904.

Figure 9:
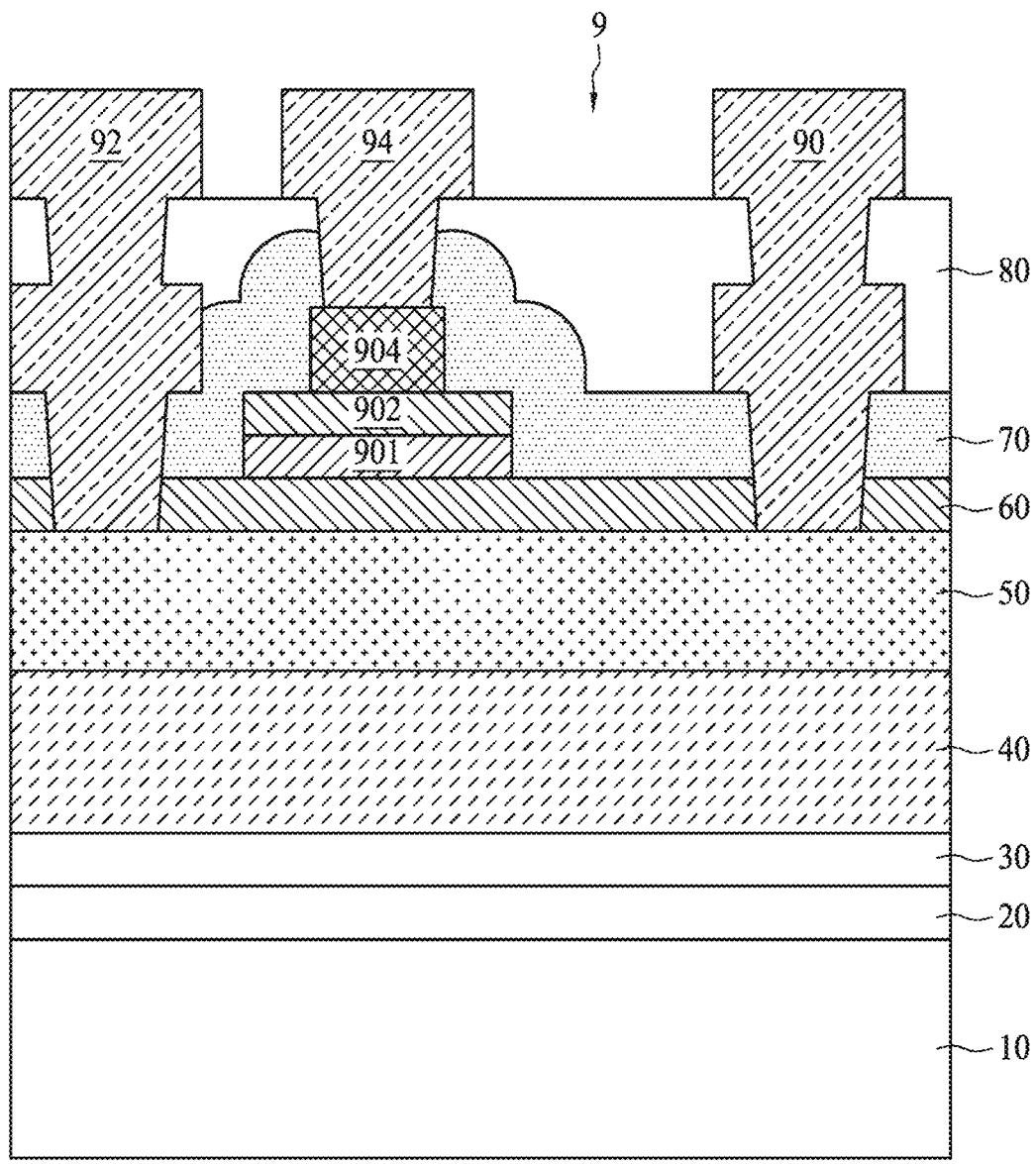
FIG. 9 is a cross-sectional view of a semiconductor apparatus according to some embodiments of the present disclosure.

FIG. 9 shows a semiconductor apparatus 9 according to some embodiments of the present disclosure.

The semiconductor apparatus 9 shown in FIG. 9 may be the same as or similar to the semiconductor apparatus 1 shown in FIG. 1. One of the differences is that the semiconductor apparatus 9 does not include the doped group III-V semiconductor 903. The conductor 904 is directly disposed on the group III-V semiconductor 902.

In the embodiments shown in FIG. 1, FIG. 2, and FIG. 6 to FIG. 9, the group III-V semiconductor, the doped group III-V semiconductor, and the conductor have the same or different horizontal widths. Because the edges of the group III-V semiconductor, the doped group III-V semiconductor, and the conductor are not exactly flush with each other, a gate leakage current path is extended, and occurrence of leakage current is reduced. In addition, the group III-V semiconductor has fewer surface defects than the doped group III-V semiconductor. Therefore, by arranging a larger part of the surface of the group III-V semiconductor on the leakage current path, the surface defects of the leakage current path are reduced on the whole, and the occurrence of the leakage current is further reduced.

As used herein, for ease of description, space-related terms such as "under", "below", "lower part", "above", "upper portion", "lower portion", "left side", "right side", and the like may be used herein to describe a relationship between one element or feature and another element or feature as shown in the figures. In addition to orientation shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

The invention claimed is:

1. A semiconductor apparatus, comprising:
   a channel layer;
   a barrier layer disposed on the channel layer;
   a source contact and a drain contact disposed on the channel layer;
   a first doped group III-V semiconductor disposed on the barrier layer and between the source contact and the drain contact;
   a group III-V semiconductor disposed on the first doped group III-V semiconductor and between the source contact and the drain contact; and
   a second doped group III-V semiconductor disposed on the group III-V semiconductor and between the source contact and the drain contact, wherein the group III-V semiconductor has a central region covered by the second doped group III-V semiconductor and a peripheral region free from coverage by the second doped group III-V semiconductor,
   wherein an entirety of the first doped group III-V semiconductor, the group III-V semiconductor, and the second doped group III-V semiconductor is spaced apart from the source contact and the drain contact.

2. The semiconductor apparatus according to claim 1, further comprising:
   a passivation layer disposed over the barrier layer and covering the peripheral region of the group III-V semiconductor.

3. The semiconductor apparatus according to claim 2, wherein the passivation layer is in contact with the peripheral region of the group III-V semiconductor.

4. The semiconductor apparatus according to claim 2, wherein the passivation layer further covers opposite sidewalls of the group III-V semiconductor.

5. The semiconductor apparatus according to claim 1, wherein the source contact and the drain contact penetrate the passivation layer and the barrier layer.

6. The semiconductor apparatus according to claim 1, further comprising:
   a conductor disposed on the second doped group III-V semiconductor and between the source contact and the drain contact.

7. The semiconductor apparatus according to claim 6, wherein the conductor and the second doped group III-V semiconductor have substantially the same horizontal width.

8. The semiconductor apparatus according to claim 1, further comprising:
   a conductor disposed on the second doped group III-V semiconductor, wherein the conductor and the second doped group III-V semiconductor have substantially the same horizontal width.

9. The semiconductor apparatus according to claim 1, further comprising:
   a conductor disposed on the second doped group III-V semiconductor; and
   a conductor structure disposed on the conductor to form an interface with the conductor, wherein the interface has a horizontal width less than a horizontal width of the conductor.

10. The semiconductor apparatus according to claim 1, wherein the source contact and the drain contact make contact with the barrier layer and the channel layer.

11. A semiconductor apparatus, comprising:
    a channel layer;
    a barrier layer disposed on the channel layer;
    a source contact and a drain contact disposed on the channel layer;
    a first doped group III-V semiconductor disposed on the barrier layer and between the source contact and the drain contact;
    a group III-V semiconductor disposed on the first doped group III-V semiconductor and between the source contact and the drain contact;
    a second doped group III-V semiconductor disposed on the group III-V semiconductor and between the source contact and the drain contact; and
    a passivation layer disposed over the barrier layer and covering the first doped group III-V semiconductor, the group III-V semiconductor, and the second doped group III-V semiconductor, wherein the passivation layer continuously extends from a top surface to a side surface of the group III-V semiconductor,
    wherein an entirety of the first doped group III-V semiconductor, the group III-V semiconductor, and the second doped group III-V semiconductor is spaced apart from the source contact and the drain contact.

12. The semiconductor apparatus according to claim 11, wherein the group III-V semiconductor has a compound composition different than those of the first doped group III-V semiconductor and the second doped group III-V semiconductor.

13. The semiconductor apparatus according to claim 11, wherein the group III-V semiconductor has a central region covered by the second doped group III-V semiconductor and a peripheral region free from coverage by the second doped group III-V semiconductor, and the passivation layer is in contact with the peripheral region of the group III-V semiconductor.

14. The semiconductor apparatus according to claim 11, wherein the passivation layer covers a side surface of the second doped group III-V semiconductor.

15. The semiconductor apparatus according to claim 11, wherein the source contact and the drain contact penetrate the passivation layer and the barrier layer.

16. The semiconductor apparatus according to claim 11, further comprising:

a conductor disposed on the second doped group III-V semiconductor and between the source contact and the drain contact, wherein the passivation layer covers a side surface of the conductor.

17. The semiconductor apparatus according to claim 16, wherein the conductor and the second doped group III-V semiconductor have substantially the same horizontal width.

18. The semiconductor apparatus according to claim 11, further comprising:

a conductor disposed on the second doped group III-V semiconductor, wherein the passivation layer surrounds a bottom portion of the conductor.

19. The semiconductor apparatus according to claim 11, further comprising:

a conductor disposed on the second doped group III-V semiconductor; and a conductor structure disposed on the conductor to form an interface with the conductor, wherein the interface has a horizontal width less than a horizontal width of the conductor.

20. The semiconductor apparatus according to claim 11, wherein the source contact and the drain contact make contact with the barrier layer and the channel layer.

* * * * *